US006124664A

United States Patent [19]

Mamayek et al.

[11] Patent Number: 6,124,664

[45] **Date of Patent: *Sep. 26, 2000**

[54] TRANSDUCER BACKING MATERIAL

[75] Inventors: Don S. Mamayek, Mountiain View; Dennis Mendoza, Tracy; Veijo Suorsa, Sunnyvale, all of Calif.

[73] Assignee: Scimed Life Systems, Inc., Maple Grove, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 09/071,747

[22] Filed: May 1, 1998

[51] Int. Cl.$^{7}$ .................................................. H01L 41/08

[52] U.S. Cl. .......................................... 310/327; 310/334

[58] Field of Search ................................... 310/327, 334, 310/335, 336

[56] References Cited

U.S. PATENT DOCUMENTS

| | | | |
|---|---|---|---|
| 4,373,401 | 2/1983 | Baumoel | 73/861.18 |
| 4,446,395 | 5/1984 | Hadjicostis | 310/327 |
| 4,482,835 | 11/1984 | Bar-Cohen et al. | 310/327 |
| 5,176,140 | 1/1993 | Kami et al. | 310/327 |
| 5,541,468 | 7/1996 | Frey et al. | 310/334 |
| 5,648,942 | 7/1997 | Kunkel, III | 367/176 |

FOREIGN PATENT DOCUMENTS

| | | |
|---|---|---|
| 0 196 652 | 8/1986 | China . |
| 61-210795 | 9/1986 | Japan . |
| 07258618 | 9/1995 | Japan . |
| 1212186 | 11/1970 | United Kingdom . |
| 1266143 | 3/1972 | United Kingdom . |
| 1266144 | 3/1972 | United Kingdom . |
| 1266145 | 3/1972 | United Kingdom . |
| 1 266 144 | 8/1972 | United Kingdom . |

*Primary Examiner*—Nestor Ramirez
*Assistant Examiner*—Peter Medley
*Attorney, Agent, or Firm*—Lyon & Lyon LLP

[57] ABSTRACT

A transducer backing material includes a sticky epoxy resin containing tungsten particles and silver particles. A method of applying a backing material to a transducer includes pouring a mixture of epoxy resin, tungsten particles, and silver particles into a mold containing a layer of piezoelectric material, degassing the mixture, and curing the mixture at a pressure of approximately one atmosphere until the mixture dries.

12 Claims, 2 Drawing Sheets

TRANSDUCER BACKING MATERIAL

BACKGROUND OF THE INVENTION

1. Field of the Invention

The present invention pertains to the field of transducers, and more particularly to transducer backing materials and methods of applying backing materials to transducers.

2. Background

Piezoelectric transducers find a wide variety of application in ultrasonic and electroacoustic technologies. Characterized by the presence of a shaped, piezoelectric material such as, for example, lead zirconate titanate (PZT), these devices convert electric signals to ultrasonic waves, and generally vice versa, by means of the piezoelectric effect in solids. This effect is well known in the art of transducers and their manufacture. A piezoelectric material is one that exhibits an electric charge under the application of stress. If a closed circuit is attached to electrodes on the surface of such a material, a charge flow proportional to the stress is observed. A transducer includes a piezoelectric element, and if necessary, an acoustic impedance matching layer, or multiple matching layers, and an acoustically absorbing backing layer.

Transducers can be manufactured according to conventional methods. Thus, a thin piezoelectric transducer element is metalized on its two surfaces with a conductive coating such as, for example, gold plating over a chrome layer. The thickness of the piezoelectric element is a function of the frequency of sound waves. One surface of the piezoelectric element can be coated with an acoustic impedance matching layer, or multiple matching layers, as desired. A backing layer may be attached to the backside of the piezoelectric element. The backing layer material is typically cast in place via a mold such that the piezoelectric element lies between the matching layer and the backing material. The matching layer, which may be formed of an electrically conductive material, serves to couple between the acoustic impedances of the piezoelectric element and the material targeted by (i.e., at the front of) the transducer. Individual piezoelectric transducers are machined from the piezoelectric-material/matching material-layer.

An ideally characterized piezoelectric transducer would transmit 100% of the ultrasonic radiation to the front of the transducer, and no ultrasonic waves to the back. It is desirable, therefore, to use a lossy material for the backing layer. A conventional backing material, for example, is an encapsulate, soft gel containing tungsten, which is known in the art to serve as an acoustic absorber. According to conventional application methods, the backing material is pressurized to about 12,000 psi. The pressurization squeezes out excess gel and gives rise to a high-density encapsulate gel with enhanced concentration of tungsten. However, even with pressurization, inconsistent electrical conductivity from lot to lot, or within a given lot, can result because the tungsten concentration is still not high enough to maintain series contact between the tungsten particles across the backing material.

To enhance electrical conductivity, flakes of silver can be added to the backing-material mix. However, the gel, which is a relatively nonsticky substance, is generally rendered less effective in adhering the piezoelectric layer to the backing layer. Consequently, manufacturing yields can decrease because a higher proportion of individual transducers may have their tops sheared off during the production process. In addition, pressurization causes inconsistent densities across a given backing material. Therefore, the acoustic impedance (the product of the density and the speed of sound) varies across the backing material, resulting in individual transducers with widely divergent characteristics. Moreover, the pressurization necessitates a long cure time for the backing material. Thus, there is a need for a backing material and application process that improve yield consistency, reduce manufacturing time, and produce more efficient transducers.

SUMMARY OF THE INVENTION

The present invention is directed to a backing material and application process that improve yield consistency, reduce manufacturing time, and produce more efficient transducers. To these ends a transducer backing material includes a sticky epoxy adhesive resin in which tungsten particles and silver particles, which can be flakes or powder, are disposed. A method of application includes the steps of pouring a mixture of epoxy resin, tungsten particles, and silver particles, into a mold containing a layer piezoelectric material, degassing the mixture, and curing the mixture for length of time. Preferably, the mixture is cured at an atmospheric pressure of approximately one atmosphere. Advantageously, the mixture can be cured in less than twenty-four hours.

Accordingly, it is an object of the present invention to provide a transducer backing material and method of application that enhance the efficiency of the transducer. These and other objects, features, aspects, and advantages of the present invention will become better understood with reference to the following description and accompanying drawings.

BRIEF DESCRIPTION OF THE DRAWINGS

The present invention is illustrated by way of example, and not by way of limitation, in the figures of the accompanying drawings and in which like reference numerals refer to similar elements, in which.

DETAILED DESCRIPTION OF THE PREFERRED EMBODIMENT

Figure 1:
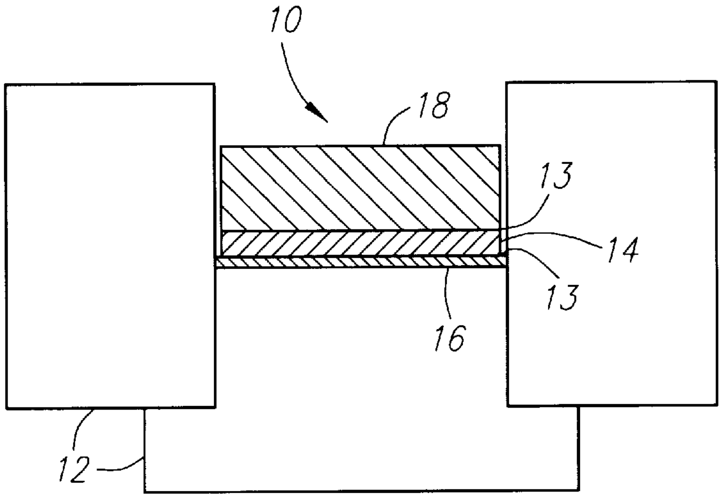
FIG. 1 is a cross-sectional side view of a mold containing materials used to form a transducer sandwich.

As illustrated in FIG. 1, a piezoelectric transducer lot, or "sandwich" 10, is manufactured by being cast into a mold 12. The transducer sandwich 10 typically includes at least three components: a layer of piezoelectric material 14, an acoustic impedance matching layer 16, and a layer of backing material 18. The backing material 18 is situated above the piezoelectric material 14 in the mold 12. The piezoelectric material 14 is situated above the acoustic impedance matching layer 16 and below the backing material 18 in the mold 12. The piezoelectric material 14 interface surfaces are each covered with a thin metal coating 13.

In a preferred embodiment, the transducer sandwich 10 is electrically conductive across its three layers 14, 16, 18.

However, it is to be understood that, alternatively, the transducer sandwich 10 can be made of nonconductive materials. Likewise, the sandwich 10 need not necessarily be made as a piezoelectric transducer sandwich; thus, an alternative material can be substituted in the manufacturing process for the piezoelectric layer 14. In the preferred embodiment herein described, however, a piezoelectric material such as, e.g., lead zirconate titanate (PZT) 14, is used.

Preferably, the PZT layer 14 is coated on both surfaces prior to placement within the mold 12 with a thin, metal coating 13 such as gold plating or gold-over-nickel plating. The matching layer 16 is then applied to the metal-coated PZT layer 14 according to a preferred method disclosed and described in related U.S. patent application Ser. No. 09/071,695, entitled Method of Applying A Matching Layer to A Transducer, filed on the same day as the present application and fully incorporated herein by reference. In the preferred embodiment, after the matching layer 16 has been adhered to the PZT layer 14, the layer combination 14, 16 is placed in the mold 12, with the matching layer 16 facing down. The backing material 18 is then poured into the mold 12 on top of the PZT layer 14, degassed, and allowed to dry, or cure, over time. In other embodiments, the matching layer is attached after formation of the PZT/backing material 14, 18 combination.

Figure 2:
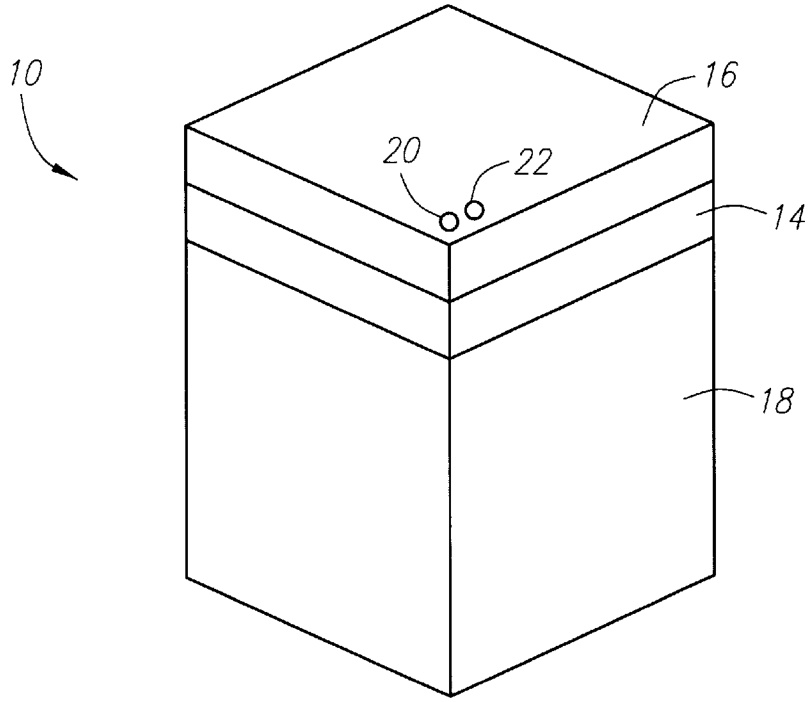
FIG. 2 is a perspective view of a transducer sandwich manufactured in the mold of FIG. 1.

In a preferred embodiment, the transducer sandwich 10 is allowed to dry in the mold 12 without being pressurized. Thus, the backing material 18 cures at the ordinary atmospheric pressure of one atmosphere, or roughly 14.7 pounds per square inch (psi). The drying time at a pressure of one atmosphere is less than one day, and is generally as short as sixteen hours or less. Once dry, the sandwich 10 is removed from the mold 12 and turned "upside down" as shown in FIG. 2. Individual transducers 20, 22 (for simplicity only two are shown; however, it is to be understood that a lot 10 generally produces a far greater number) are stamped, or machined, into the top, or PZT 14/matching-layer 16 side, of the sandwich 10, creating a "waffle."

In a preferred embodiment, the backing material 18 is made of sticky epoxy resin. The preferred backing material 18 also contains particles of tungsten and particles of silver mixed into the epoxy resin. In some embodiments, the silver particles are flakes. In other embodiments, silver powder is used. The tungsten particles change the characteristic impedance of the backing material 18. In one embodiment two sizes of tungsten particle—roughly fifty-five micrometers and 6.6 micrometers in diameter, respectively—and silver flakes of about twenty micrometers in diameter are used. Preferably, the proportion of tungsten particles to resin material is approximately forty percent, and the proportion of silver flakes to resin material is approximately fifty percent. Further, flakes or powder of other electrically conductive metals such as, e.g., copper, could be substituted for silver.

The presence of silver flakes in the epoxy resin renders electrical conductivity consistent across the backing material 18, thereby alleviating the need to enhance the electrical conductivity by pressurizing the backing-material mixture 18 during preparation of the transducer sandwich 10. In the absence of pressurization, however, a greater proportion of resin remains in the backing material 18 after curing. But in the preferred embodiment herein disclosed, sticky epoxy resin is used. In contrast to soft encapsulate gel, the epoxy resin creates a stronger adhesion between the PZT surface 14 and the backing material 18 upon drying or curing. Thus, a lesser number of individual transducers is lost from each sandwich 10.

Figure 3:
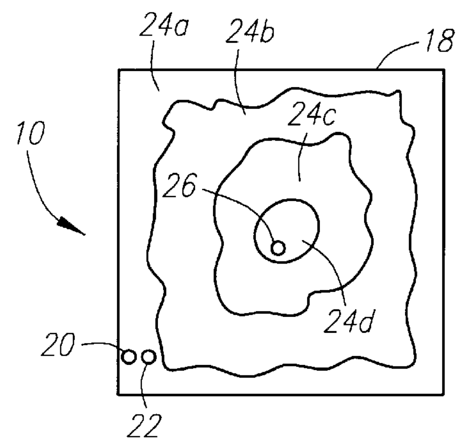
FIG. 3 is a representation of an acoustic image of the transducer sandwich of FIG. 2.

Curing the sandwich 10 without pressure takes between one-sixth and one-fourth the time to cure under pressure. Moreover, curing the sandwich 10 under pressure can produce varying acoustic impedance in the backing material 18 across a given sandwich 10, as depicted in FIG. 3. As shown, acoustic impedance in the center **24*d* of the backing material 18 differs from acoustic impedance in a concentric ring 24*c*, which differs from acoustic impedance in a concentric ring 24*b* of greater diameter, which differs still from acoustic impedance at the edge 24*a* of the backing material 18. Acoustic impedance, which is defined as density multiplied by the speed of sound and is measured in millions of Rayls, or MRayls, or millions of kilograms per second per square meter, is a fundamental design characteristic of an ultrasonic piezoelectric transducer. Thus, a transducer 26 that is made from the center 24*d* of the backing material 18 and a transducer 20 that is made from the edge 24*a* of the backing material 18 can have widely divergent operating characteristics if the backing material 18 was pressurized during preparation. In some embodiments, transducers are stamped from the backing material 18**. In other embodiments, transducers are machined from the backing material.

Figure 4:
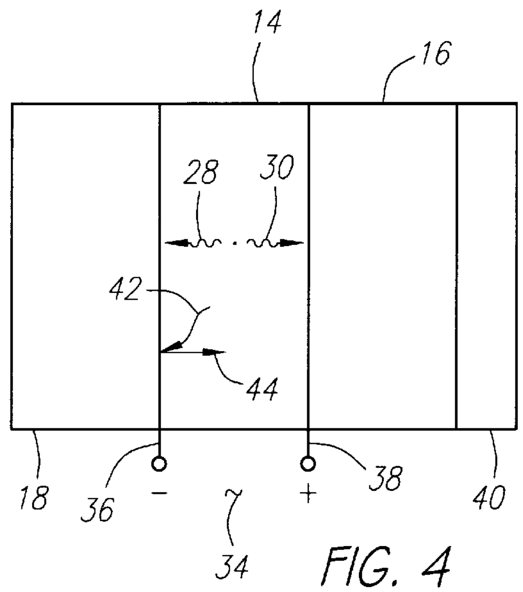
FIG. 4 is a block diagram of a transducer machined from the transducer sandwich of FIG. 2.

Thus, as discussed above, using silver flakes in a sticky epoxy resin eliminates the need to pressurize the backing material 18 as it dries in the mold 12, without sacrificing electrical conductivity or manufacturing yield per sandwich 10. The absence of pressure not only speeds up manufacturing throughput and improves the design consistency for a given sandwich 10, but also enhances the efficiency of the transducers. As illustrated in FIG. 4, sound-pressure waves 28, 30 are initiated in the the PZT layer 14 of a transducer 32 by the application of an electrical signal 34 across the PZT layer 14 via lead terminals 36, 38. The waves 28, 30 propagate in opposite directions, with wave 28 traveling toward the back of the transducer 32, and wave 30 moving toward the front of the transducer 32. At the front of the transducer 32 is a target material, or tissue 40, which is in contact with the matching layer 16. The tissue generally has an acoustic impedance of approximately 1.5 MRayls. The matching layer 16 is preferably designed to exhibit an acoustic impedance of about six MRayls. The PZT layer 14 preferably has an acoustic impedance of roughly thirty-three MRayls. If pressurized to cure, the backing material 18 generally achieves an acoustic impedance of about twenty MRayls. However, in the absence of pressure during drying, the backing material 18 has an acoustic impedance of roughly 7.5 MRayls. It is known that the more closely matched the acoustic impedances of a pair of adjacent media are through which an ultrasonic wave 42 propagates, the smaller the portion 44 of the wave 42 that will be reflected as the wave 42 crosses the boundary between the two media. In a transducer 32, it is ideally desirable that all of the sound-pressure waves travel toward the front of the transducer 32. Thus, the transducer 32 is more efficient if the reflected portion 44 of each ultrasonic wave 42 is maximized. The converse of the above-stated axiom is that the less closely matched the acoustic impedances are, the greater is the portion 44 of the wave 42 that gets reflected at the boundary, and the more efficient is the transducer 32. The acoustic impedance of the backing material 18 is less closely matched to the acoustic impedance of the PZT layer 14 in the absence of pressure during preparation. Hence, a transducer 32 that has been prepared without pressure is generally more efficient than one that has been subjected to pressure during preparation.

Figure 5:
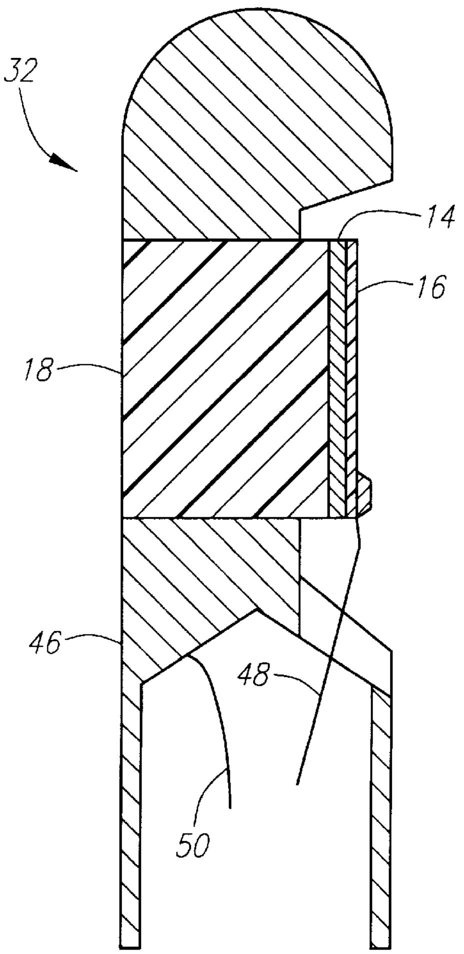
FIG. 5 is a cross-sectional side view of the transducer represented in FIG. 4.

As depicted in FIG. 5, an individual, electrically conductive, piezoelectric transducer 32 preferably includes a distal housing 46. The housing 46 holds the transducer material such that the matching layer 16 faces the front of the transducer 32, i.e., the face of the transducer that is aimed toward the material to be targeted (not shown). The PZT layer 14 is situated between the matching layer 16 and the backing layer 18. The distal housing 46 can be made of, e.g., stainless steel. A first lead 48 is connected to the matching layer 16, and a second lead 50 is connected to the housing 46. The leads 48, 50 can be attached to a transmission line (not shown) so that in a preferred embodiment, an electrical signal can be transmitted from the first lead 48 through the matching layer 16, through the PZT layer 14, through the backing material 18, and through the distal housing 46 to the second lead 50. In one embodiment the housing 46 measures approximately 0.029 inches from front to back.

Figure 6:
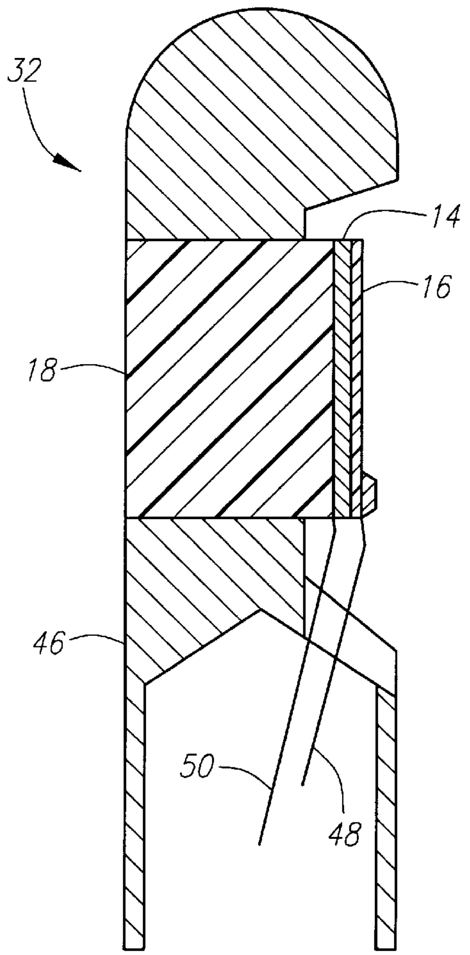
FIG. 6 is a cross-sectional side view of the transducer represented in FIG. 4, according to an alternative embodiment.

Turning to FIG. 6, it depicts an alternatively preferred embodiment of piezoelectric transducer 32. The distal housing 46 in FIG. 6 does not need to be a conductive. Accordingly, the lead 50 is directly connected to a surface of the backing layer 18 and passes, along with the first lead 48, through the distal housing 46. In such an embodiment, the backing 18 need not be composed of a conductive material, nor does the matching layer 16.

Only preferred embodiments have been shown and described, yet it will be apparent to one of ordinary skill in the art that numerous alterations may be made without departing from the spirit or scope of the invention. Therefore, the invention is not to be limited except in accordance with the following claims.

What is claimed is:

1. A backing material for a transducer, comprising:

sticky epoxy resin;

a plurality of tungsten particles disposed in the epoxy resin, said tungsten particles further comprising a mixture of tungsten particles having a diameter of about 55 μm and tungsten particles having a diameter of about 6.6 μm; and a plurality of silver particles disposed in the epoxy resin, said plurality of silver particles having a diameter of about 20 μm.

2. The backing material of claim 1, wherein the backing material is cured during manufacture of the transducer at a pressure of approximately 14.7 pounds per square inch.

3. The backing material of claim 1, further comprising a cross-sectional surface area, the respective tungsten and silver particles distributed in the epoxy resin such that the backing material is consistently electrically conductive across the cross-sectional surface area.

4. The backing material of claim 1, the respective tungsten and silver particles distributed in the epoxy resin such that the backing material has an acoustic impedance of approximately 7.5 MRayls.

5. The backing material of claim 4, further comprising a cross-sectional surface area, the acoustic impedance being measurable at approximately 7.5 MRayls at any given measurement point in said cross-sectional surface area.

6. A transducer, comprising:

an acoustic impedance matching layer;

an electrically conductive piezoelectric layer positioned adjacent the acoustic impedance matching layer, the piezoelectric layer including at least one surface covered with a metal coating;

an epoxy resin backing material positioned adjacent the piezoelectric layer;

a plurality of tungsten particles disposed in the epoxy resin backing material, said tungsten particles further comprising a mixture of tungsten particles having a diameter of about 55 μm and tungsten particles having a diameter of about 6.6 μm;

a plurality of silver particles disposed in the epoxy resin backing material, said plurality of silver particles having a diameter of about 20 μm; and a housing supporting the epoxy resin backing material.

7. The transducer of claim 6, wherein the acoustic impedance matching layer is electrically conductive.

8. The transducer of claim 6, wherein the housing supporting the epoxy resin backing material is electrically conductive.

9. The transducer of claim 8, wherein the housing is connected to at least one electrically conductive lead.

10. The transducer of claim 6, wherein the epoxy resin backing material is electrically conductive.

11. A backing material for a transducer, said backing material comprising:

a sticky epoxy resin curable at substantially 14.7 p.s.i.;

a plurality of silver particles disposed in the epoxy resin, said plurality of silver particles having a diameter of about 20 μm and such that said backing material is consistently electrically conductive along a selected cross-sectional surface area thereof; and a plurality of tungsten particles disposed in said backing material, said tungsten particles further comprising a mixture of tungsten particles having a diameter of about 55 μm and tungsten particles having a diameter of about 6.6 μm, and wherein the respective tungsten and silver particles being distributed in the epoxy resin such that the backing material has an acoustic impedance of substantially 7.5 MRayls or less.

12. The backing material of claim 11 wherein said silver particles are selected from the group of silver flakes and silver powder.

* * * * *